(12) United States Patent
Yamamoto et al.

(10) Patent No.: US 11,101,162 B2
(45) Date of Patent: Aug. 24, 2021

(54) CHUCK TABLE, CUTTING APPARATUS, AND METHOD CORRECTING CHUCK TABLE

(71) Applicant: DISCO CORPORATION, Tokyo (JP)

(72) Inventors: Setsuo Yamamoto, Tokyo (JP); Kazuma Sekiya, Tokyo (JP)

(73) Assignee: DISCO CORPORATION, Tokyo (JP)

(*) Notice: Subject to any disclaimer, the term of this patent is extended or adjusted under 35 U.S.C. 154(b) by 290 days.

(21) Appl. No.: 16/293,009

(22) Filed: Mar. 5, 2019

(65) Prior Publication Data

US 2019/0273010 A1    Sep. 5, 2019

(30) Foreign Application Priority Data

Mar. 5, 2018    (JP) .............................. JP2018-038871

(51) Int. Cl.
*H01L 21/683*    (2006.01)
*H01L 21/67*    (2006.01)
*B25B 11/00*    (2006.01)

(52) U.S. Cl.
CPC ........ *H01L 21/6838* (2013.01); *B25B 11/005* (2013.01); *H01L 21/67092* (2013.01); *H01L 21/6836* (2013.01); *H01L 2221/68327* (2013.01)

(58) Field of Classification Search
CPC ......... B23Q 3/088; B25B 11/005; B28D 7/04; B28D 7/046; H01L 21/67092; H01L 21/6836; H01L 21/6838; H01L 2221/68327; H01L 2221/68331
See application file for complete search history.

(56) References Cited

U.S. PATENT DOCUMENTS

| | | | | |
|---|---|---|---|---|
| 8,685,839 | B2 * | 4/2014 | Furuta ..................... | H01L 21/78 438/463 |
| 2006/0203222 | A1 * | 9/2006 | Ohmiya ................ | B25B 11/005 355/72 |
| 2007/0045799 | A1 * | 3/2007 | Sekiya .............. | H01L 21/67132 257/678 |
| 2011/0294279 | A1 * | 12/2011 | Okamura ............. | B28D 5/0011 438/460 |
| 2017/0372908 | A1 * | 12/2017 | Shigematsu ........... | B28D 5/022 |

FOREIGN PATENT DOCUMENTS

JP    2000323440 A    11/2000

* cited by examiner

*Primary Examiner* — Tyrone V Hall, Jr.
(74) *Attorney, Agent, or Firm* — Greer Burns & Crain, Ltd.

(57) ABSTRACT

A chuck table includes a main part having a holding surface for holding thereon a workpiece through a dicing tape, and a frame holder disposed around the main part for holding the annular frame. The main part has a flat surface that functions as the holding surface, an outer circumferential suction groove defined in a region of the holding surface that underlies an annular region of the adhesive tape between the workpiece and the frame of the frame unit, for holding the annular region of the adhesive tape under suction, and a suction channel held in fluid communication with the outer circumferential suction groove and a suction source. The frame holder pulls down the frame to a position lower than the holding surface to hold the dicing tape in close contact with the holding surface.

14 Claims, 15 Drawing Sheets

CHUCK TABLE, CUTTING APPARATUS, AND METHOD CORRECTING CHUCK TABLE

BACKGROUND OF THE INVENTION

Field of the Invention

The present invention relates to a chuck table, a cutting apparatus, and a method of correcting a chuck table.

Description of the Related Art

Generally, there are known dicing saws, i.e., cutting apparatus, for cutting a wafer on which various devices such as semiconductor devices, optical devices, SAW filter devices, etc. are formed thereon, or a workpiece of ceramics or glass, or a packaged device, into individual device chips. A cutting apparatus cuts a workpiece that is fixed to a chuck table by a dicing tape with a cutting blade. It is known in the art to be able to prevent the workpiece from developing chippings especially on its reverse side and cracks at corners thereof by firmly securing the workpiece to the chuck table against vibrations while cutting the workpiece. In order to apply attractive suction forces to the entire surface of the workpiece, a suction plate of porous ceramics is used on the chuck table for attracting the workpiece under suction to the chuck table (see, for example, Japanese Patent Laid-Open No. 2000-323440).

SUMMARY OF THE INVENTION

However, while the suction plate of porous ceramics can apply attractive suction forces to the entire surface of the workpiece, since the suction plate has minute pores throughout its entire surface, the suction plate is unable to support the workpiece at positions corresponding to the pores, and the workpiece tends to develop chippings at the positions corresponding to the pores.

It is therefore an object of the present invention to provide a chuck table, a cutting apparatus, and a method of correcting a chuck table, which are capable of preventing a workpiece from developing chippings on its reverse side and corner cracks at the time the workpiece is cut.

In accordance with an aspect of the present invention, there is provided a chuck table for holding thereon a frame, unit including an annular frame and a workpiece supported on the annular frame by an adhesive tape and disposed in an opening defined in the annular frame. The chuck table includes a main part having a holding surface for holding thereon the workpiece through the adhesive tape, and a frame holder disposed around the main part for holding the annular frame. The main part has a flat surface that functions as the holding surface, an outer circumferential suction groove defined in a region of the holding surface that underlies an annular region of the adhesive tape between the workpiece and the frame of the frame unit, for holding the annular region of the adhesive tape under suction, and a suction channel held in fluid communication with the outer circumferential suction groove and a suction source. The frame holder pulls down the frame to a position lower than the holding surface to hold the adhesive tape in close contact with the holding surface.

In the above arrangement, the outer circumferential suction groove may include an annular groove for surrounding the workpiece.

The flat surface that functions as the holding surface may be made of silicon.

The main part may include a conductive area may be disposed in a portion of the holding surface and made of a conductor, and the conductor of the conductive area may be electrically connected to an outer circumferential surface of the chuck table held in contact with a support base that supports the chuck table thereon or a reverse side of the chuck table that is opposite the holding surface thereof.

The conductor may include carbon or resin mixed with carbon. The chuck table may further include an inner suction groove defined in an area of the holding surface that is positioned radially inwardly of the outer circumferential suction groove and held in fluid communication with the outer circumferential suction groove.

In accordance with another aspect of the present invention, there is also provided a cutting apparatus for cutting a workpiece with a cutting blade. The cutting apparatus includes the chuck table described above, an incising feed unit relatively moving a spindle on which the cutting blade is mounted with respect to the chuck table in incising feed directions perpendicular to the holding surface, and a detecting circuit detecting a position of a tip end of the cutting blade in the incising feed directions by way of electric conduction between the tip end of the cutting blade and the holding surface of the chuck table. The detecting circuit electrically interconnects the spindle and the chuck table and detects the position by way of electric conduction upon contact between the holding surface and the cutting blade.

In the above arrangement, the cutting blade may contact a conductive area of the holding surface.

In accordance with still another aspect of the present invention, there is also provided a method of correcting a chuck table of a cutting apparatus. The cutting apparatus including the chuck table described above, a spindle with a cutting blade mounted thereon for cutting a workpiece held on the chuck table, a processing feed unit relatively moving the chuck table with respect to the spindle in processing feed directions perpendicular to an axis of rotation of the spindle, an indexing feed unit relatively moving the spindle with respect to the chuck table in indexing feed directions parallel to the axis of rotation, and an incising feed unit relatively moving the spindle with respect to the chuck table in incising feed directions perpendicular to the processing feed directions and the indexing feed directions. The method includes cutting the holding surface with the cutting blade held at a predetermined height for cutting into the holding surface of the chuck table, thereby forming a corrected surface to be used as a new holding surface.

In the above arrangement, the method may further include causing the cutting blade to cut into the holding surface of the chuck table to a depth smaller than the depth of the outer circumferential suction groove.

The chuck table according to the aspect of the present invention includes the flat surface functioning as the holding surface, the outer circumferential suction groove defined in the region of the holding surface that underlies the annular region of the adhesive tape between the workpiece and the frame of the frame unit, for holding the annular region of the adhesive tape under suction, and the suction channel held in fluid communication with the outer circumferential suction groove and the suction source. Consequently, the workpiece is supported on the holding surface as the flat surface through the adhesive tape, so that the workpiece is prevented from developing chippings on its reverse side and corner cracks at the time the workpiece is cut.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Preferred embodiments of the present invention will hereinafter be described in detail with reference to the drawings. The present invention is not limited by the details of the embodiments described below. The components described below cover those which could easily be envisaged by those skilled in the art and those which are essentially identical to those described above. Furthermore, the arrangements described below can be combined in appropriate manners. Various omissions, replacements, or changes of the arrangements may be made without departing from the scope of the present invention.

Figure 1:
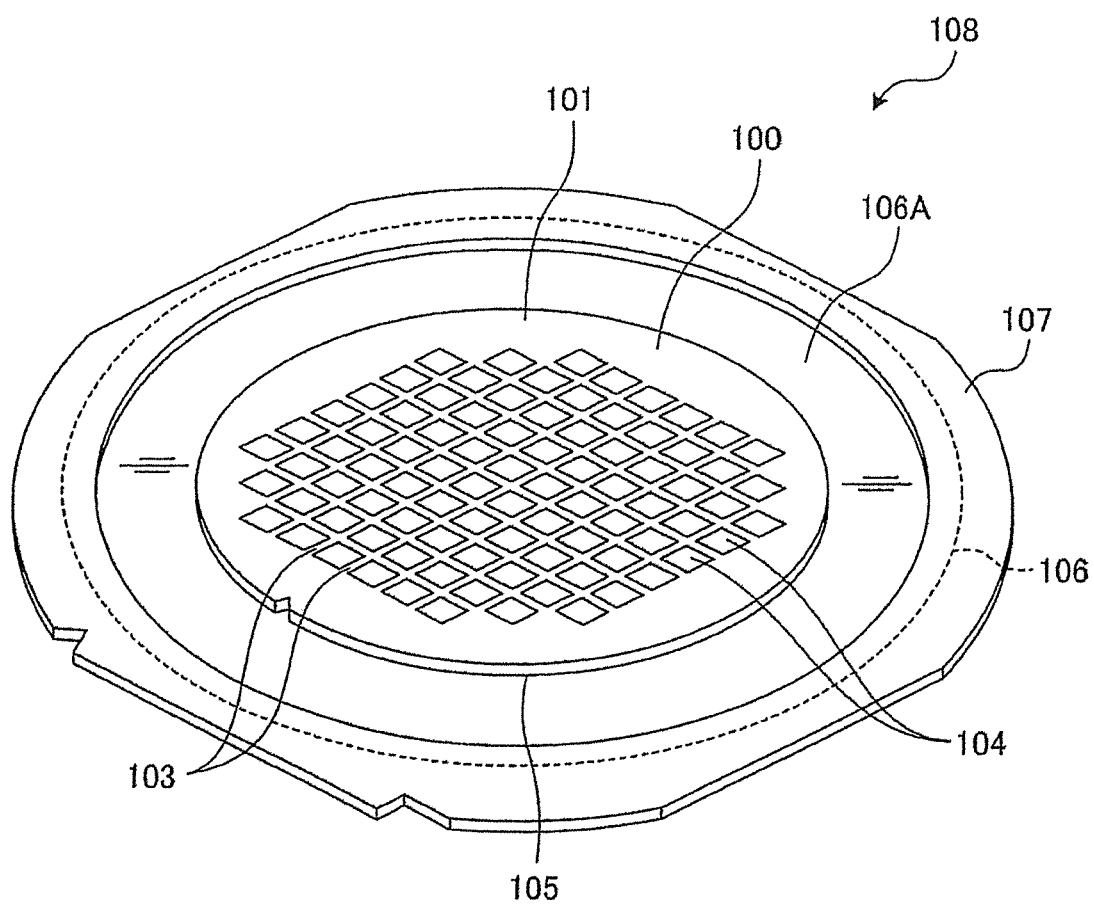
FIG. 1 is a perspective view of a frame unit including a workpiece to be processed by a cutting apparatus according to an embodiment of the present invention.

FIG. 1 is a perspective view of a frame unit including a workpiece to be processed by a cutting apparatus according to an embodiment of the present invention.

As illustrated in FIG. 1, a workpiece, denoted by 100, is a disk-shaped semiconductor wafer or optical device wafer including a substrate 101 made of silicon, sapphire, gallium, or the like. The workpiece 100 has a plurality of devices 104 formed in respective areas demarcated in a grid pattern by a plurality of projected dicing lines 103 on a face side 102 of the substrate 101. A dicing tape 106 as an adhesive tape is stuck to a reverse side 105 of the substrate 101, which is opposite the face side 102. The dicing tape 106 is larger in diameter than the substrate 101. An annular frame 107 is stuck to an outer peripheral region of the dicing tape 106. Therefore, the workpiece 100 is supported on the annular frame 107 by the dicing tape 106 and positioned in the circular opening defined in the annular frame 107. According to the present embodiment, the workpiece 100, the dicing tape 106, and the annular frame 107 jointly make up a frame unit 108. The dicing tape 106 includes an annular region 106A that is defined between the workpiece 100 and the annular frame 107.

The substrate 101 of the workpiece 100 is not limited to any particular material, shape, structure, size, etc. The substrate 101 may be any one of substrates made of materials including ceramics, resin, metal, etc. and having desired shapes. The devices 104 is not limited to any particular type, number, shape, structure, size, layout, etc. Furthermore, the face side 102 of the substrate 101 of the workpiece 100 may be covered with a deposited insulative layer having a low dielectric constant, referred to as "low-k layer," as a functional layer, and the low-k layer may support circuits of the devices.

Figure 2:
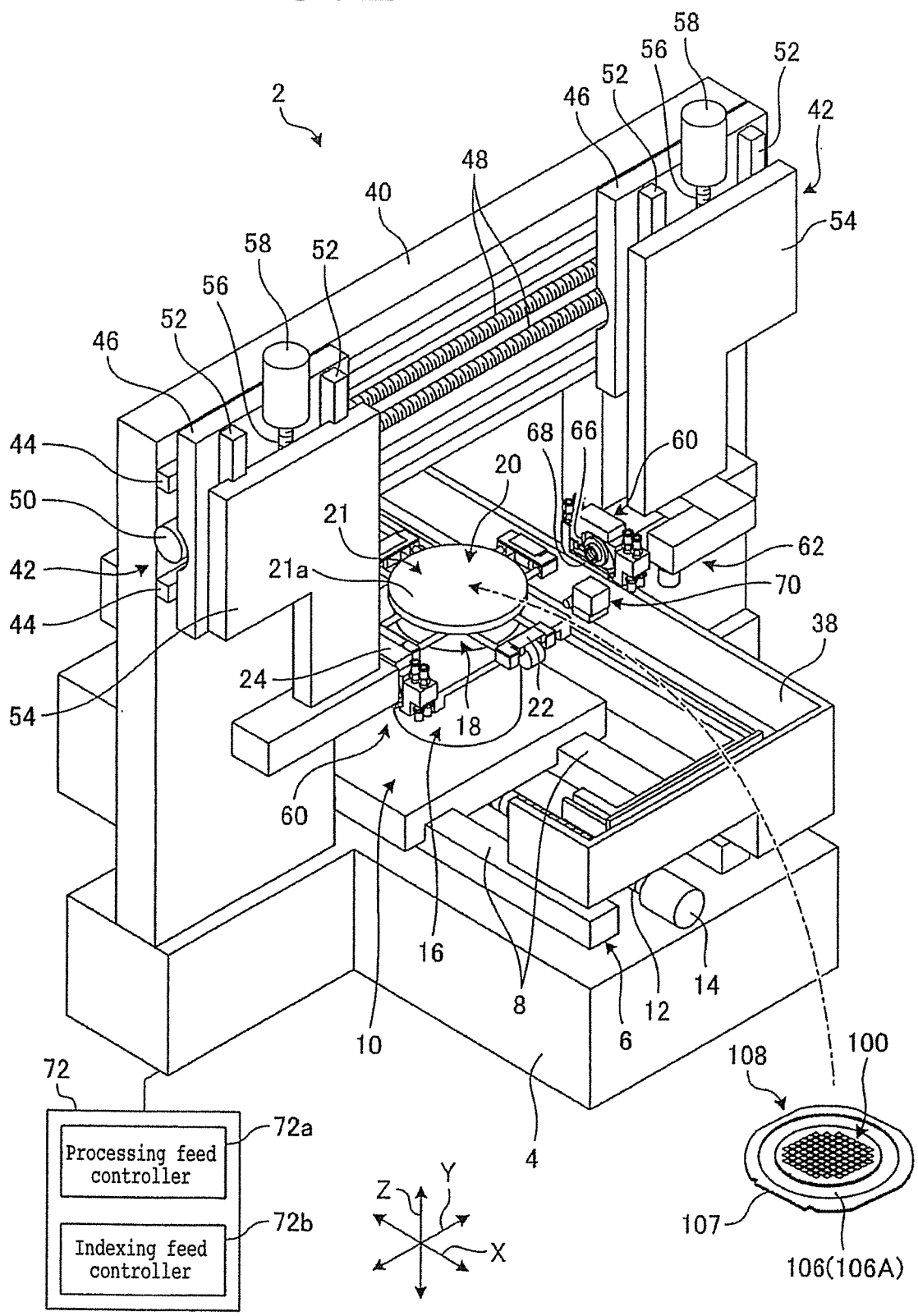
FIG. 2 is a perspective view of the cutting apparatus according to the embodiment.
Figure 3:
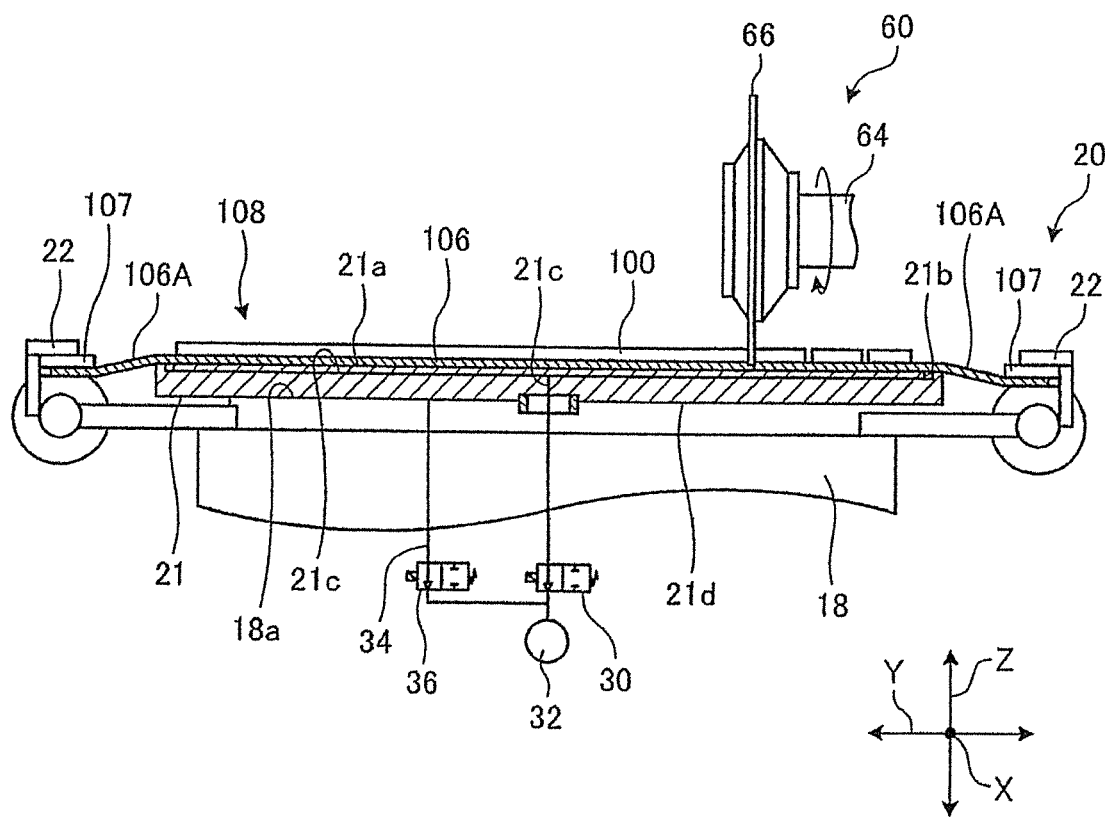
FIG. 3 is a sectional side elevational view of the cutting apparatus, illustrating the manner in which the cutting apparatus cuts the workpiece that is held on a chuck table of the cutting apparatus.
Figure 4:
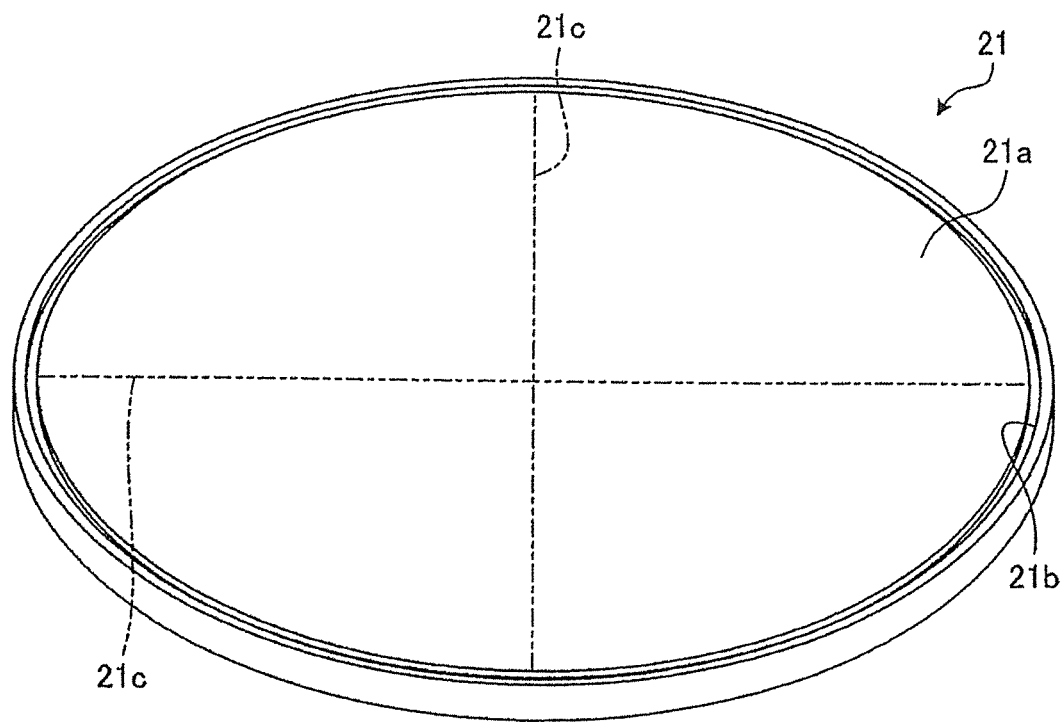
FIG. 4 is a perspective view of a main part of the chuck table.
Figure 5:
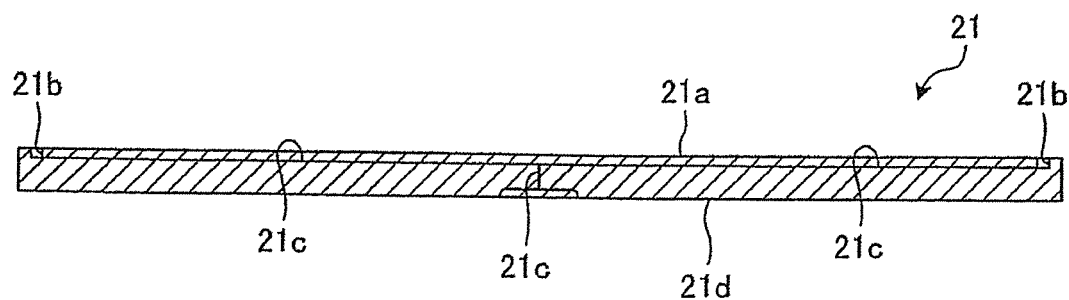
FIG. 5 is a sectional side elevational view of the main part of the chuck table.
Figure 6:
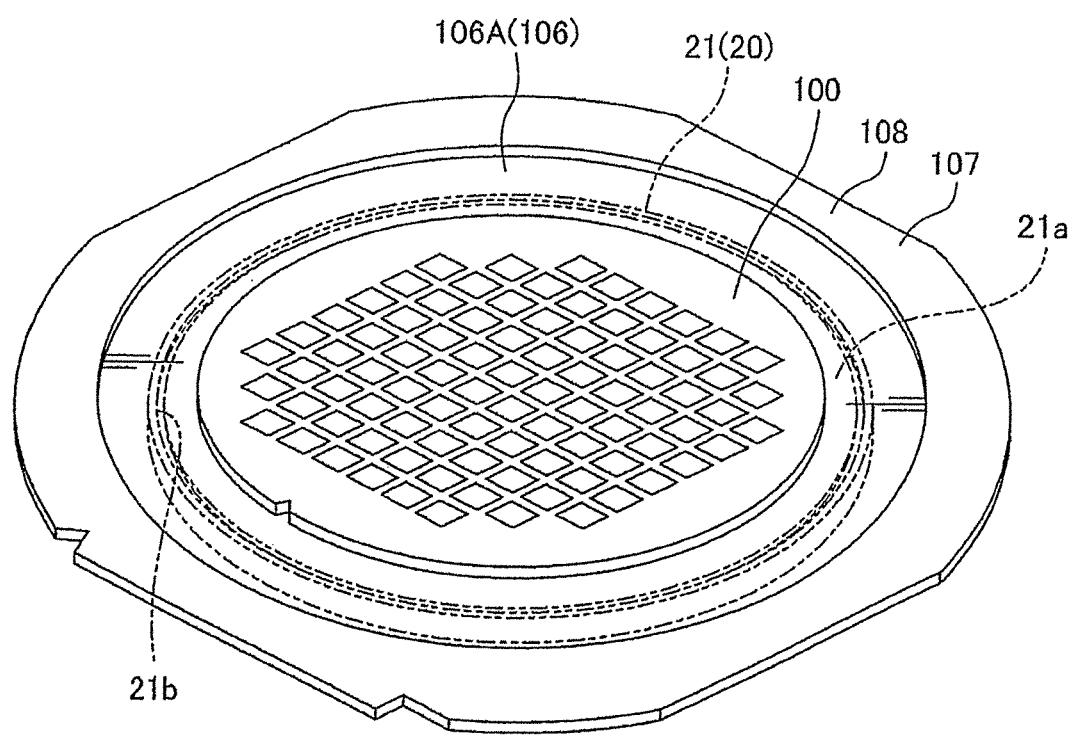
FIG. 6 is a perspective view of the frame unit that is placed on the main part of the chuck table.

A cutting apparatus according to the present embodiment will be described below. FIG. 2 is a perspective view of the cutting apparatus according to the embodiment. FIG. 3 is a sectional side elevational view of the cutting apparatus, illustrating the manner in which the cutting apparatus cuts the workpiece that is held on a chuck table of the cutting apparatus. FIG. 4 is a perspective view of a main part of the chuck table. FIG. 5 is a sectional side elevational view of the main part of the chuck table. FIG. 6 is a perspective view of the frame unit that is placed on the main part of the chuck table. X-, Y-, and Z-axis directions referred to hereinafter are perpendicular to each other.

As illustrated in FIG. 2, a cutting apparatus, denoted by 2, includes a base 4 on which the components of the cutting apparatus 2 are placed. The cutting apparatus 2 includes an X-axis moving mechanism or processing feed unit 6 disposed on an upper surface of the base 4. The X-axis moving mechanism 6 has a pair of X-axis guide rails 8 extending generally parallel to the X-axis directions or processing feed directions, and an X-axis movable table 10 slidably mounted on the X-axis guide rails 8.

The X-axis movable table 10 has on a lower surface thereof a fixed nut, not depicted, threaded over an X-axis ball screw 12 parallel to the X-axis guide rails 8. The X-axis ball screw 12 has an end coupled to an X-axis stepping motor 14 mounted on the upper surface of the base 4.

When the X-axis stepping motor 14 is energized, it rotates the X-axis ball screw 12 about its own axis, moving the X-axis movable table 10 in one of the X-axis directions along the X-axis guide rails 8. The X-axis moving mechanism 6 includes an X-axis measuring unit, not depicted, for measuring positions of the X-axis movable table 10 along the X-axis directions.

The X-axis movable table 10 supports on its upper surface or face side a θ table 16 that supports a chuck table base or support base 18 on its upper end. The chuck table base 18 is made of an electric conductor such as metal or the like. The chuck table base 18 supports on an upper surface 18a thereof (see FIG. 3) a chuck table 20 for holding the workpiece 100 thereon. The X-axis moving mechanism 6 including the X-axis movable table 10 has its upper region covered with a table cover 24 and a bellows-like cover, not depicted.

The θ table 16 includes a rotary actuator, not depicted, such as an electric motor or the like, that rotates the chuck table base 18 and the chuck table 20 about a rotational axis extending generally parallel to the Z-axis directions or incising feed directions. When the X-axis moving mechanism 6 moves the X-axis movable table 10 in the X-axis directions, the chuck table 20 is processing-fed in the X-axis directions.

As illustrated in FIG. 3, the chuck table 20 includes a main part 21 for holding the workpiece 100 of the frame unit 108 through the dicing tape 106, and four clamps or frame holders 22 disposed at angularly spaced intervals around the main part 21 for securing or holding the frame 107 of the frame unit 108.

The main part 21 has a diameter larger than the workpiece 100, and is in the form of a disk severed from a cylindrical semiconductor ingot made of silicon or the like. The main part 21 has an upper holding surface 21a for holding the workpiece 100 thereon. The holding surface 21a is formed as a flat surface free of pores like those of porous ceramics, and has a surface roughness (Ry) of 3 µm or lower, preferably 1 µm or lower.

As illustrated in FIGS. 4 and 5, the main part 21 has a suction groove or outer circumferential suction groove 21b defined in an outer circumferential region of the holding surface 21a for surrounding the workpiece 100. The suction groove 21b is held in fluid communication with a suction channel 21c defined in the main part 21. As illustrated in FIG. 3, a suction source 32 such as an ejector or the like is connected to the suction channel 21c through a first valve 30, etc. The main part 21 also has a recess defined in a lower surface 21d thereof for positioning itself with respect to the chuck table base 18. The suction groove 21b is of an annular shape and has a diameter larger than the workpiece 100. Specifically, as illustrated in FIG. 6, the suction groove 21b is defined in an area of the holding surface 21a that underlies the annular region 106A of the dicing tape 106 between the workpiece 100 and the frame 107 when the frame unit 108 is placed on the main part 21 of the chuck table 20. Therefore, the suction groove 21b attracts and holds the annular region 106A of the dicing tape 106 under suction due to a negative pressure applied from the suction source 32 via the suction channel 21c.

Consequently, the workpiece 100 is supported, through the dicing tape 106, on the flat holding surface 21a that is positioned radially inwardly of the suction groove 21b. As depicted in FIG. 3, the negative pressure from the suction source 32 is also supplied to the upper surface 18a of the chuck table base 18 via a second suction channel 34 and a second valve 36. When the lower surface 21d of the main part 21 of the chuck table 20 is placed on and positionally aligned with the upper surface 18a of the chuck table base 18 and the negative pressure from the suction source 32 acts on the upper surface 18a of the chuck table base 18, the main part 21 of the chuck table 20 is secured to the chuck table base 18.

According to the present embodiment, the suction groove 21b is illustrated as an annular groove. However, the suction groove 21b is not limited to an annular groove, but may be a loop shape such as a polygonal shape or may be one or more arcuate shapes. Alternatively, dotted or intermittent suction grooves may be defined in an area of the holding surface 21a that underlies the annular region 106A of the dicing tape 106.

As illustrated in FIG. 3, for fixing the frame unit 108 to the chuck table 20, the clamps 22 pull down the frame 107 to a position lower than the holding surface 21a of the main part 21 and keep the frame 107 in that position. Since the dicing tape 106 is held in close contact with the holding surface 21a, the workpiece 100 is firmly supported on the holding surface 21a through the dicing tape 106.

As illustrated in FIG. 2, the cutting apparatus 2 includes a water case 38 disposed in the vicinity of the X-axis movable table 10 for temporarily storing a waste liquid such as a cutting liquid, e.g., pure water or the like, that is used in a cutting process. The waste liquid stored in the water case 38 is discharged out of the cutting apparatus 2 through a drain, not depicted. A delivery mechanism, not depicted, for delivering the workpiece 100 to the chuck table 20 is disposed in a position near the chuck table 20.

The cutting apparatus 2 further includes a portal-shaped support structure 40 disposed above the X-axis moving mechanism 6 on the upper surface of the base 4. Two cutting unit moving mechanisms, i.e., indexing feed units and incising feed units, 42 are mounted on an upper front surface of the support structure 40. The cutting unit moving mechanisms 42 include a common pair of Y-axis guide rails 44 disposed on the upper front surface of the support structure 40 and extending generally parallel to the Y-axis directions, i.e., indexing-feed directions as leftward and rightward directions. The cutting unit moving mechanisms 42 have respective Y-axis movable plates 46 slidably mounted on the Y-axis guide rails 44.

The Y-axis movable plates 46 have on their reverse sides respective fixed nuts, not depicted, threaded over respective Y-axis ball screws 48 parallel to the Y-axis guide rails 44. The Y-axis ball screws 48 has respective ends coupled to respective Y-axis stepping motors 50 mounted on the upper front surface of the support structure 40. When the Y-axis stepping motors 50 are energized, they rotate the Y-axis ball screws 48 about their own axes, moving the Y-axis movable plates 46 in one of the Y-axis directions along the Y-axis guide rails 44.

A pair of Z-axis guide rails 52 extending generally parallel to the Z-axis directions are mounted on a front surface or face side of each of the Y-axis movable plates 46. A Z-axis movable plate 54 is slidably mounted on the Z-axis guide rails 52 on each of the Y-axis movable plates 46.

Each of the Z-axis movable plates 54 has on its reverse side a fixed nut, not depicted, threaded over a Z-axis ball screw 56 parallel to the Z-axis guide rails 52. The Z-axis ball screw 56 has an end coupled to a Z-axis stepping motor 58 mounted on the front surface of the Y-axis movable plate 46. When the Z-axis stepping motor 58 is energized, it rotates the Z-axis ball screw 56 about its own axis, moving the Z-axis movable plate 54 in one of the Z-axis directions along the Z-axis guide rails 52.

Each of the cutting unit moving mechanisms 42 includes a Y-axis measuring unit, not depicted, for measuring positions of the Y-axis movable plate 46 along the Y-axis directions. Each of the cutting unit moving mechanisms 42 also includes a Z-axis measuring unit, not depicted, for measuring positions of the Z-axis movable plate 54 along the Z-axis directions.

A cutting unit 60 for cutting the workpiece 100 on the chuck table 20 is mounted on a lower portion of each of the Z-axis movable plates 54. A camera or image capturing unit 62 for capturing an image of the workpiece 100 is mounted on the lower portion of each of the Z-axis movable plates 54 at a position adjacent to the cutting unit 60. Therefore, when the Y-axis movable plates 46 are moved in the Y-axis directions by the cutting unit moving mechanisms 42, the cutting units 60 and the cameras 62 are indexing-fed in the Y-axis directions, and when Z-axis movable plates 54 are moved in the Z-axis directions by the cutting unit moving mechanisms 42, the cutting units 60 and the cameras 62 are incising-fed in the Z-axis directions.

Positions in the X-axis directions of the cutting units 60 and the cameras 62 with respect to the chuck table 20, etc. are measured by the X-axis measuring units. Positions in the Y-axis directions of the cutting units 60 and the cameras 62 with respect to the chuck table 20, etc. are measured by the Y-axis measuring units. Positions in the Z-axis directions of the cutting units 60 and the cameras 62 with respect to the chuck table 20, etc. are measured by the Z-axis measuring units.

As illustrated in FIG. 3, each of the cutting units 60 has a spindle 64 rotatable about an axis generally parallel to the Y-axis directions. Specifically, the spindle 64 has a central axis extending generally perpendicularly to the X-axis directions and generally parallel to the Y-axis directions. An annular cutting blade 66 is mounted on an end of the spindle 64. A rotary actuator, not depicted, such as an electric motor is coupled to the other end of the spindle 64. The cutting blade 66 is rotatable about its own axis by a torque transmitted from the rotary actuator through the spindle 64. The workpiece 100 is formed cut grooves by the cutting units 60, and divided into individual device chips.

According to the present embodiment, the workpiece 100 is supported, through the dicing tape 106, on the flat holding surface 21*a* positioned radially inwardly of the suction groove 21*b*. Since the holding surface 21*a* is free of recesses such as pores, forces by which the workpiece 100 is pressed downwardly against the holding surface 21*a* at the time the workpiece 100 is cut are reliably borne by the holding surface 21*a*. Consequently, the workpiece 100 is prevented from developing chippings especially on its reverse side 105 and cracks at corners thereof.

A cutting liquid supply nozzle 68 (see FIG. 2) for supplying a cutting liquid such as pure water or the like to the workpiece 100, the cutting blade 66, etc. is disposed in the vicinity of each of the cutting blades 66. A blade position detecting unit 70 for detecting the position or height of a lower tip end of the cutting blade 66 in the Z-axis directions is disposed below each of the cutting blades 66. The cutting apparatus 2 includes a control unit 72 for controlling the various components, described above, of the cutting apparatus 2 according to processing conditions for the workpiece 100. The control unit 72 includes a processing feed controller 72*a* for controlling a processing feed process and an indexing feed controller 72*b* for controlling an indexing feed process.

Figure 7:
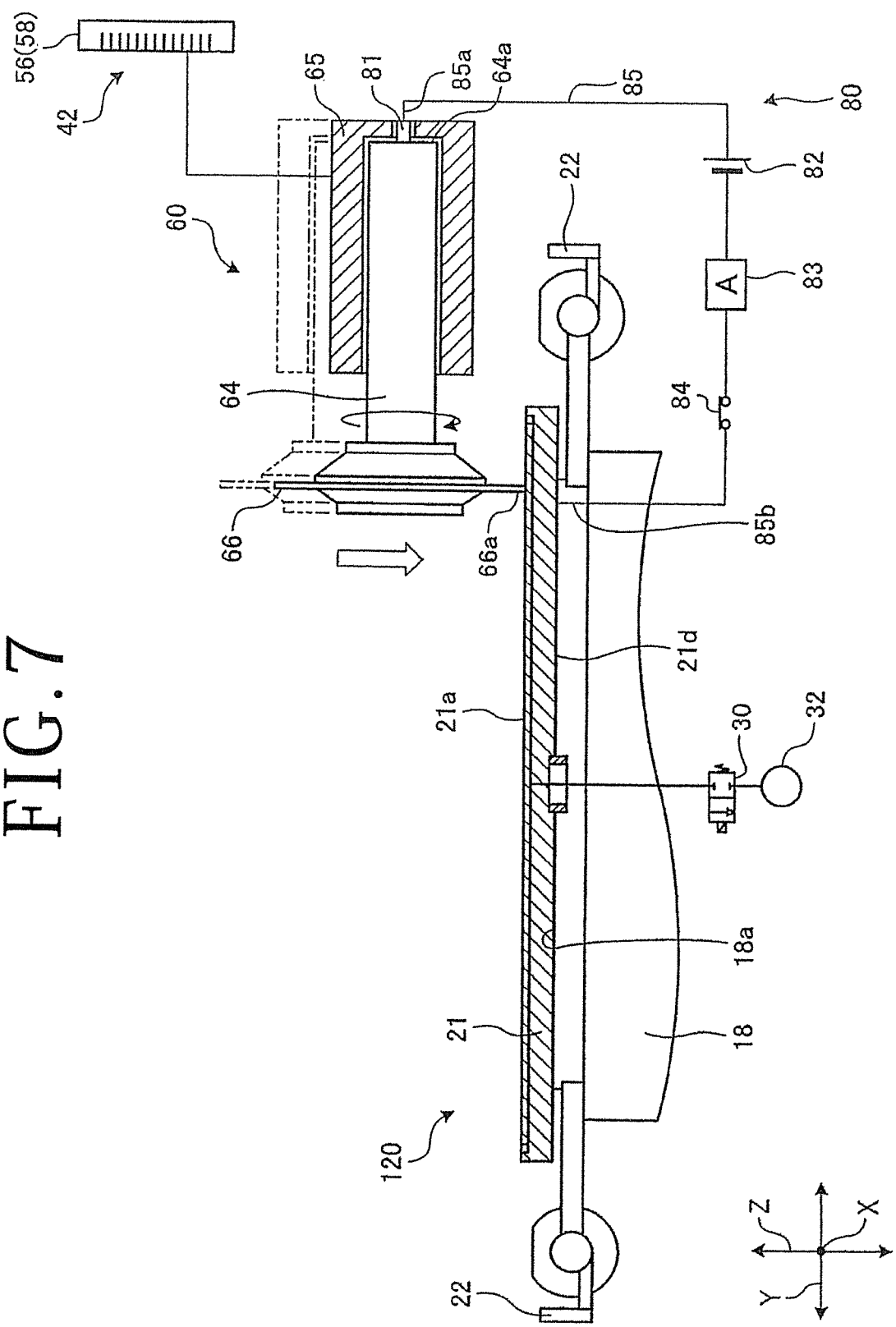
FIG. 7 is a schematic view illustrating a detecting circuit for detecting a home position for a cutting blade.

Next, a system for detecting a home position for the cutting blade 66 of each of the cutting units 60 will be described below. FIG. 7 is a schematic view illustrating a detecting circuit for detecting a home position for the cutting blade 66. Although one of the cutting units 60 and a detecting circuit combined therewith are illustrated, the other cutting unit 60 and a detecting circuit combined therewith are similarly arranged and will not be described below. According to the cutting apparatus 2 arranged as described above, the chuck table 20 that is holding the workpiece 100 thereon and the cutting units 60 are moved relatively to each other in the X-axis directions, the Y-axis directions, and the Z-axis directions to cut the workpiece 100. For thus cutting the workpiece 100, it is necessary to make an advance setting in the cutting apparatus 2 about a height or home position that serves as a reference for the cutting blade 66 in order to control a depth to which the cutting blade 66 is to cut into the workpiece 100. To meet the requirement, the cutting apparatus 2 has a detecting circuit 80 for detecting a home position for the cutting blade 66, as illustrated in FIG. 7. The detecting circuit 80 detects the position of a lower tip end 66*a* of the cutting blade 66 upon contact with the holding surface 21*a* of the main part 21 of the chuck table 20 as a home position in the Z-axis directions by way of electric conduction.

The cutting unit 60 has a housing 65 that houses the spindle 64 and the electric motor, not depicted, therein. The housing 65 is supplied with compressed air. The supplied compressed air functions as an air bearing, not depicted, by which the spindle 64 is rotatably supported in the housing 65.

The detecting circuit 80 includes an electrode terminal 81 disposed on a rear end, illustrated as a right end in FIG. 7, of the housing 65, a power supply 82, an ammeter 83, a switch 84, and a lead 85 electrically interconnecting the electrode terminal 81, the power supply 82, the ammeter 83, and the switch 84. The lead 85 has an end 85*a* connected to the electrode terminal 81 and another end 85*b* connected to the lower surface 21*d* of the main part 21 of the chuck table 20. The electrode terminal 81 is resiliently biased by a spring, not depicted, to contact an end face of the spindle 64, which may include the rotor of the electric motor.

For detecting a home position that serves as a reference for the cutting blade 66 in an incising direction or the Z-axis directions, the switch 84 is closed and then the cutting unit moving mechanism or incising feed unit 42 is actuated to lower the cutting unit 60. When the lower tip end 66*a* of the cutting blade 66 contacts the holding surface 21*a* of the main part 21 of the chuck table 20, the cutting blade 66, the main part 21, the switch 84, the ammeter 83, the power supply 82, the electrode terminal 81, and the spindle 64 make a closed circuit. The main part 21 is made of a semiconductor. Therefore, an electric current flows through the closed circuit, and is detected by the ammeter 83. In other words, the detecting circuit 80 electrically interconnects the spindle 64 on which the cutting blade 66 is mounted and the chuck table 20 through the lead 85, and detects a home position for the lower tip end 66*a* of the cutting blade 66 in the Z-axis directions by way of electric conduction upon contact between the holding surface 21*a* of the main part 21 and the lower tip end 66*a* of the cutting blade 66.

The control unit 72 defines the position of the cutting blade 66 in the Z-axis directions measured the instant the ammeter 83 detects an electric current, as a home position for the cutting blade 66 in the Z-axis directions, and stores the detected home position in a memory, not depicted. Thereafter, the cutting apparatus 2 can cut the workpiece 100 to an appropriate depth based on the home position. Heretofore, it has been customary to detect a home position for a cutting blade combined with a conventional chuck table having a metal frame surrounding a porous surface by causing the cutting blade to cut into the metal frame. The conventional chuck table with the metal frame is problematic in that since the cutting blade is easily clogged up with metal particles when it cuts the metal frame, the cutting blade tends to become dull after the home position for the cutting blade has been detected. According to the present embodiment, since the chuck table 20 is made of a brittle material such as silicon or the like, it has good machinability and does not easily clog up the cutting blade 66 when the cutting blade 66 cuts into the chuck table 20. Consequently, the cutting blade 66 is prevented from becoming dull even after the home position therefor has been detected.

The cutting apparatus 2 according to the present embodiment is capable of forming cut grooves in the workpiece 100 to a depth designated with the accuracy of microns by detecting the position where the holding surface 21a of the chuck table 20 and the lower tip end 66a of the cutting blade 66 contact each other. The cutting apparatus 2 is thus able to process the workpiece 100 which includes a function layer or low-k layer on the face side 102 of the substrate 101 to remove the function layer only or to leave the function layer only. For achieving the processing accuracy, it is important that the upper holding surface 21a of the chuck table 20 lie parallel to the X-axis directions or processing feed directions. In addition, it is also necessary to manage, with high accuracy, error sources such as variations in the surface height of the chuck table base 18 that supports the chuck table 20 thereon and variations in the thickness of the main part 21 of the chuck table 20. However, it is difficult to maximize the parallelism between the holding surface 21a of the chuck table 20 and the X-axis directions or processing feed directions simply by managing those error sources. The inventor of the present invention has devised a chuck table correcting method for correcting the holding surface 21a of the chuck table 20 to increase the parallelism between the holding surface 21a and the X-axis directions or processing feed directions and sufficiently increasing the accuracy with which the cutting blade 66 cuts into the workpiece 100.

The chuck table correcting method that is carried on the cutting apparatus 2 will be described in detail below. According to the present embodiment, the chuck table correcting method includes a rotating step for rotating the cutting blade 66 about its own axis and a positioning step for positioning the lower tip end 66a of the cutting blade 66 at a height where it cuts into the holding surface 21a of the main part 21.

Specifically, the cutting blade 66 is rotated about its own axis at a rotational speed suitable for cutting the chuck table 20. The cutting blade 66 is positioned in a region outside of the chuck table 20 in the X-axis directions and the Y-axis directions, and the lower tip end 66a of the cutting blade 66 is positioned lower than the holding surface 21a in the Z-axis direction.

Thereafter, a holding surface correcting step of the chuck table correcting method is performed to cut the holding surface 21a of the chuck table 20 with the cutting blade 66 by moving the chuck table 20 and the cutting unit 60 relatively to each other while maintaining the height of the cutting blade 66 in the Z-axis directions or incising feed directions. The holding surface correcting step includes a processing feed step for moving the chuck table 20 and the cutting unit 60 relatively to each other in one of the X-axis directions and an indexing feed step for moving the chuck table 20 and the cutting unit 60 relatively to each other in one of the Y-axis directions.

Figure 8:
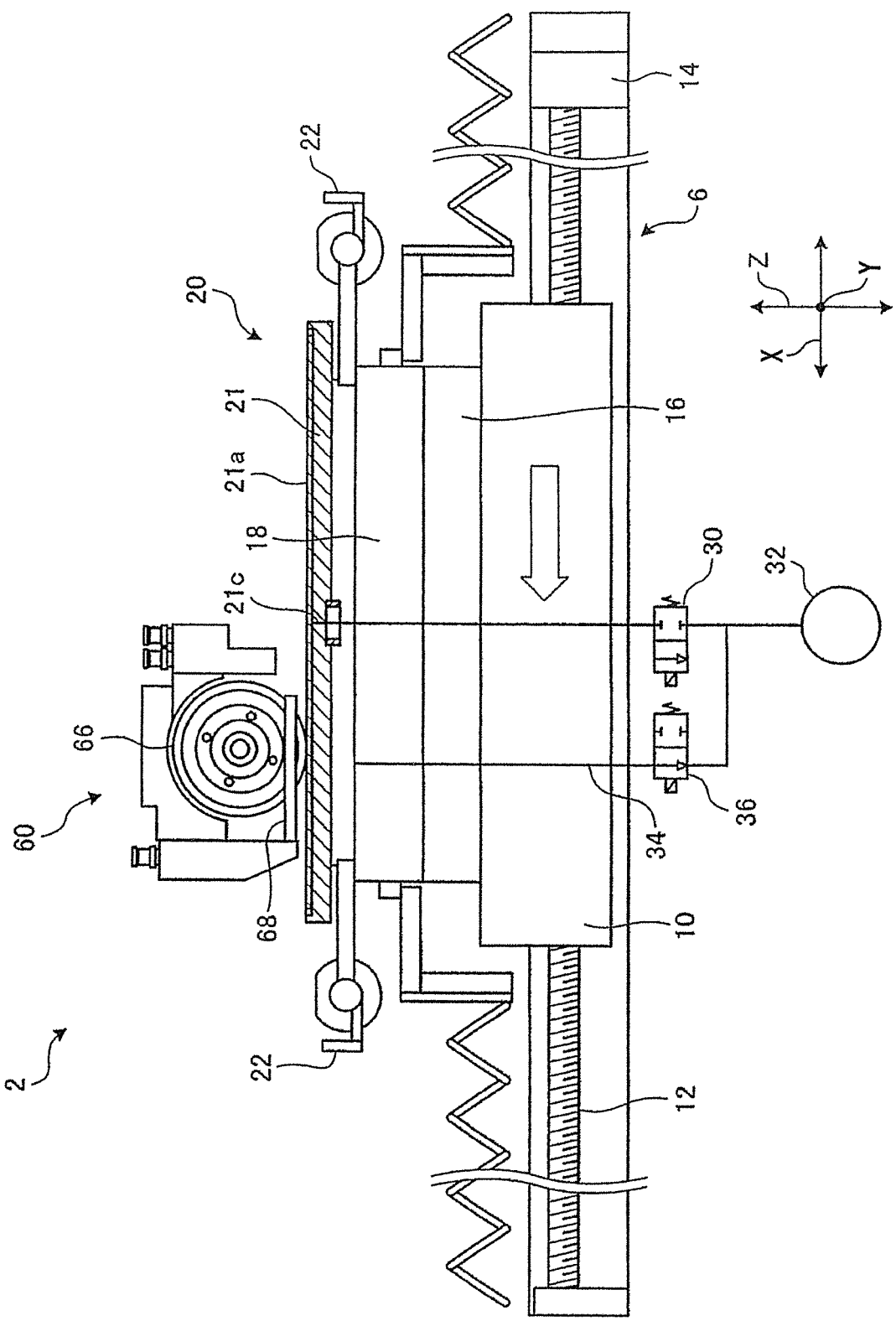
FIG. 8 is a schematic view illustrating a processing feed step performed on the cutting apparatus.
Figure 9:
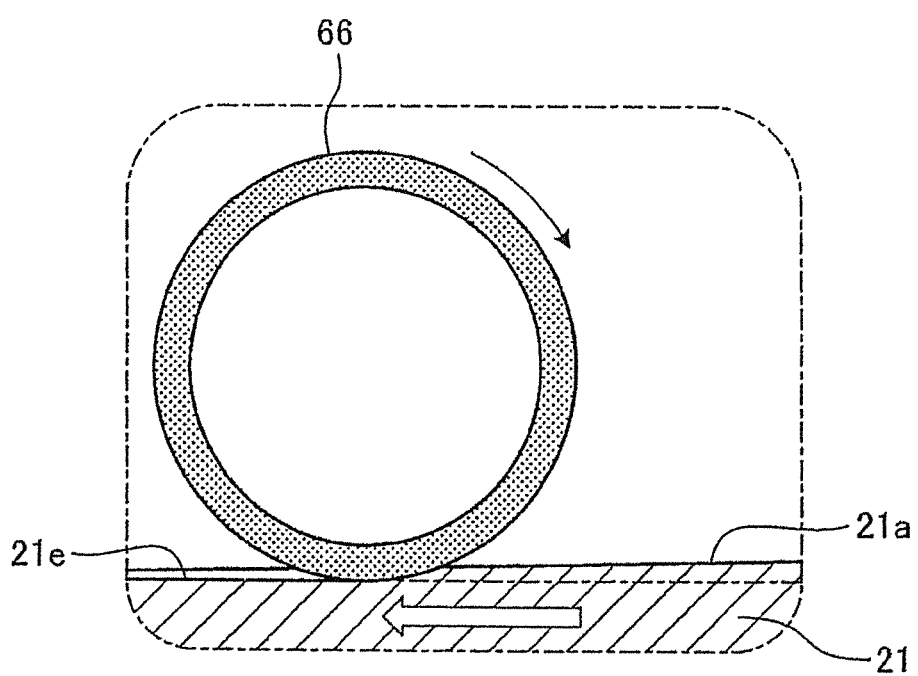
FIG. 9 is an enlarged schematic view of a portion of the cutting apparatus illustrated in FIG. 8.

FIG. 8 is a schematic view illustrating the processing feed step performed on the cutting apparatus 2, and FIG. 9 is an enlarged schematic view of a portion of the cutting apparatus 2 illustrated in FIG. 8. As illustrated in FIGS. 8 and 9, in the processing feed step, the processing feed controller 72a of the control unit 72 moves the chuck table 20 and the cutting unit 60 relatively to each other in one of the X-axis directions to cause the cutting blade 66 to cut into the main part 21 of the chuck table 20.

More specifically, the X-axis moving mechanism 6 moves the chuck table 20 in one of the X-axis directions. The holding surface 21a of the main part 21 of the chuck table 20 is now cut by the cutting blade 66, forming a corrected surface 21e that is elongate in the X-axis directions. The corrected surface 21e has a width, i.e., a length in the Y-axis directions, depending on the thickness of the cutting blade 66, e.g., a length in the Y-axis directions.

Therefore, by using a thick cutting blade having a thickness of 1 mm or more, preferably 5 mm or more, it is possible to form as wide a corrected surface 21e in one stroke of the cutting blade 66, so that the main part 21 of the chuck table 20 can be corrected efficiently. When the main part 21 of the chuck table 20 has moved to a region not overlapping the cutting blade 66 as viewed along the Z-axis directions, the processing feed step is finished. The depth to which the cutting blade 66 cuts into the holding surface 21a of the main part 21 of the chuck table 20 is smaller than the depth of the suction groove 21b to its bottom. Therefore, suction forces developed in the suction groove 21b to attract the workpiece 100 to the holding surface 21a are prevented from being reduced by the corrected surface 21e.

Figure 10:
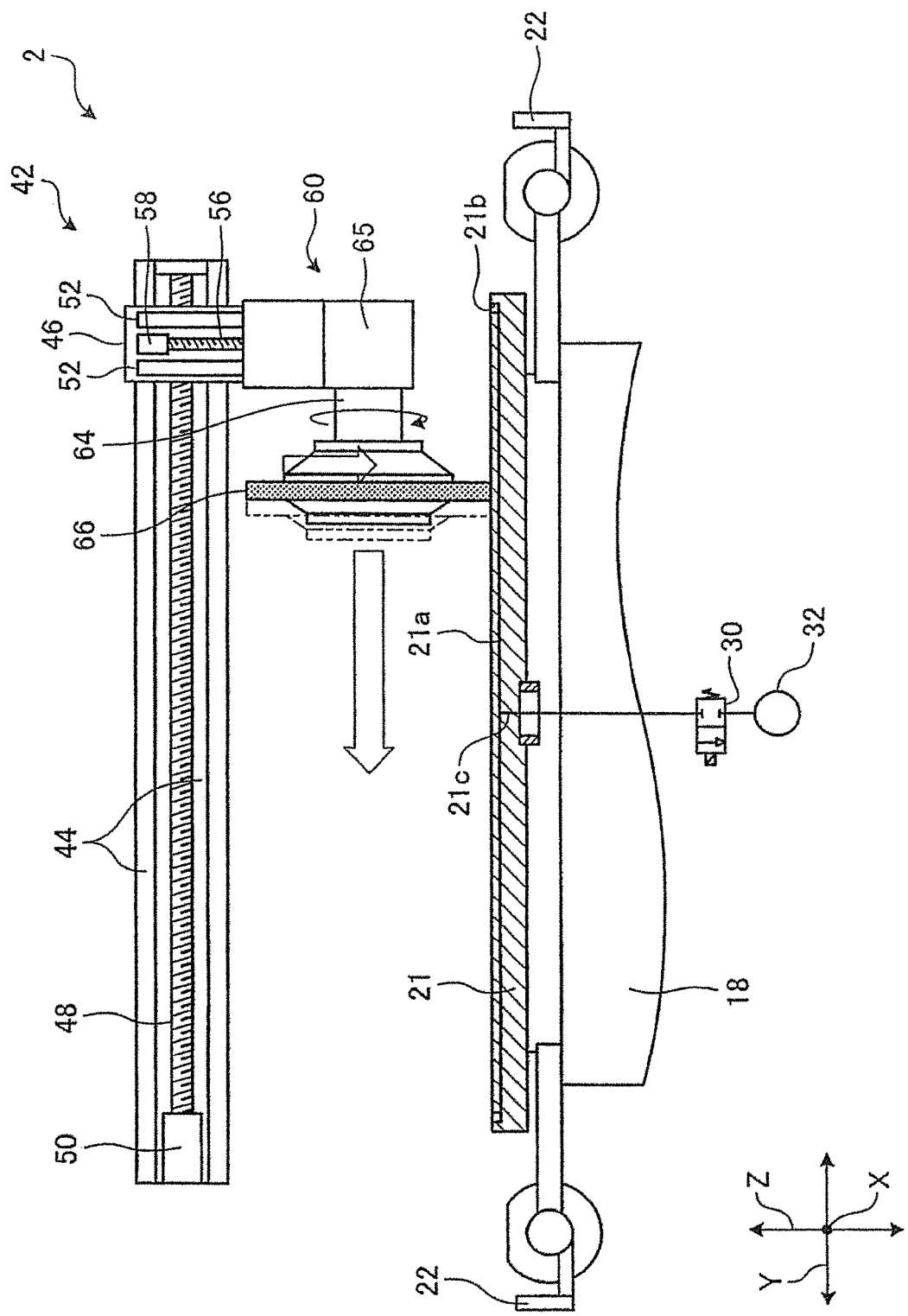
FIG. 10 is a schematic view illustrating an indexing feed step performed on the cutting apparatus.
Figure 11:
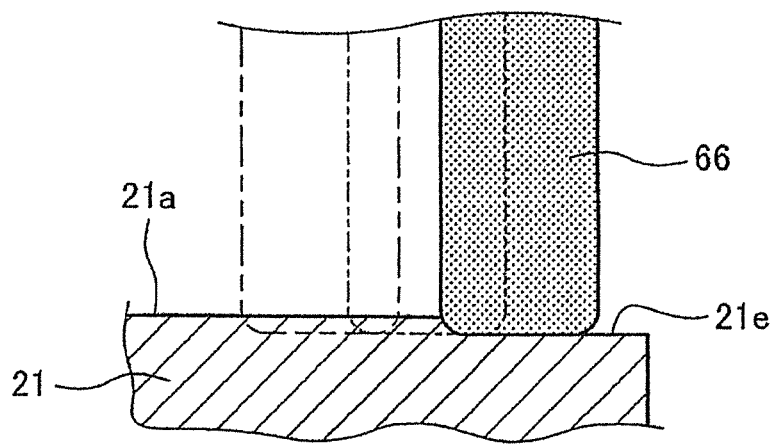
FIG. 11 is an enlarged schematic view of a portion of the cutting apparatus illustrated in FIG. 10.

The processing feed step is followed by the indexing feed step. FIG. 10 is a schematic view illustrating the indexing feed step performed on the cutting apparatus 2. FIG. 11 is an enlarged schematic view of a portion of the cutting apparatus 2 illustrated in FIG. 10. As illustrated in FIGS. 10 and 11, in the indexing feed step, the indexing feed controller 72b of the control unit 72 moves the chuck table 20 and the cutting unit 60 relatively to each other in one of the Y-axis directions.

More specifically, the cutting unit moving mechanism 42 moves the cutting unit 60 in one of the Y-axis directions by a distance smaller than the thickness of the cutting blade 66. The distance by which the cutting unit 60 is moved should preferably be as large as possible insofar as a plurality of corrected surfaces 21e formed by the cutting blade 66 in successive strokes are free of steps therebetween. For example, the distance by which the cutting unit 60 is moved may be equal to the thickness of the cutting blade 66 that excludes curved edge areas at the ends of the cutting blade 66.

After the indexing feed step, the processing feed step is carried out again. As described above, the chuck table 20 and the cutting unit 60 has been moved relatively to each other by the distance smaller than the thickness of the cutting blade 66 in one of the Y-axis directions in the preceding indexing feed step. Therefore, as illustrated in FIG. 11, the trajectory of the cutting blade 66 in the present processing feed step has a lower end partly overlapping the corrected surface 21e formed in the previous processing feed step.

The processing feed step and the indexing feed step are alternately repeated until corrected surfaces 21e are formed all over the holding surface 21a. When corrected surfaces 21e are formed all over the holding surface 21a, the holding surface correcting step is finished.

The corrected surfaces 21e formed in the holding surface correcting step reflect effects of the accuracy with which the chuck table 20 is mounted on the chuck table base 18 and a slight inclination of the chuck table 20 that is caused by motions, e.g., pitching and yawing, of the X-axis moving mechanism 6, providing the diameter of the cutting blade 66 remains unchanged by wear.

Therefore, the corrected surfaces 21e formed all over the main part 21 of the chuck table 20 for use as a new holding surface are able to cancel out the effects of the accuracy with which the chuck table 20 is mounted on the chuck table base 18 and a slight inclination of the chuck table 20 that is caused by motions of the X-axis moving mechanism 6, as described above, making it possible to sufficiently increase the accuracy with which the cutting blade 66 cuts into the workpiece 100.

For example, if a thin function layer having a thickness ranging from approximately 1 μm to 5 μm is deposited on the face side 102 of the substrate 101 of the workpiece 100 and is to be removed along the projected dicing lines 103, then the chuck table correcting method referred to above may be used to correct the holding surface 21a of the main part 21 of the chuck table 20 into corrected surfaces 21e that function as a new holding surface. After the corrected surfaces 21e are formed, a cutting blade suitable for removing the function layer is mounted on the cutting unit 60. According to the present embodiment, the corrected surfaces 21e that have been formed reflect the effects of the accuracy with which the chuck table 20 is mounted on the chuck table base 18 and a slight inclination of the chuck table 20 that is caused by motions of the X-axis moving mechanism 6. Therefore, the corrected surfaces 21e are able to cancel out the effects of the accuracy with which the chuck table 20 is mounted on the chuck table base 18 and a slight inclination of the chuck table 20 that is caused by motions of the X-axis moving mechanism 6, as described above, making it possible to sufficiently increase the accuracy with which the cutting blade 66 cuts into the workpiece 100. As a result, the cutting blade can remove the thin function layer from the workpiece 100 appropriately.

Figure 12:
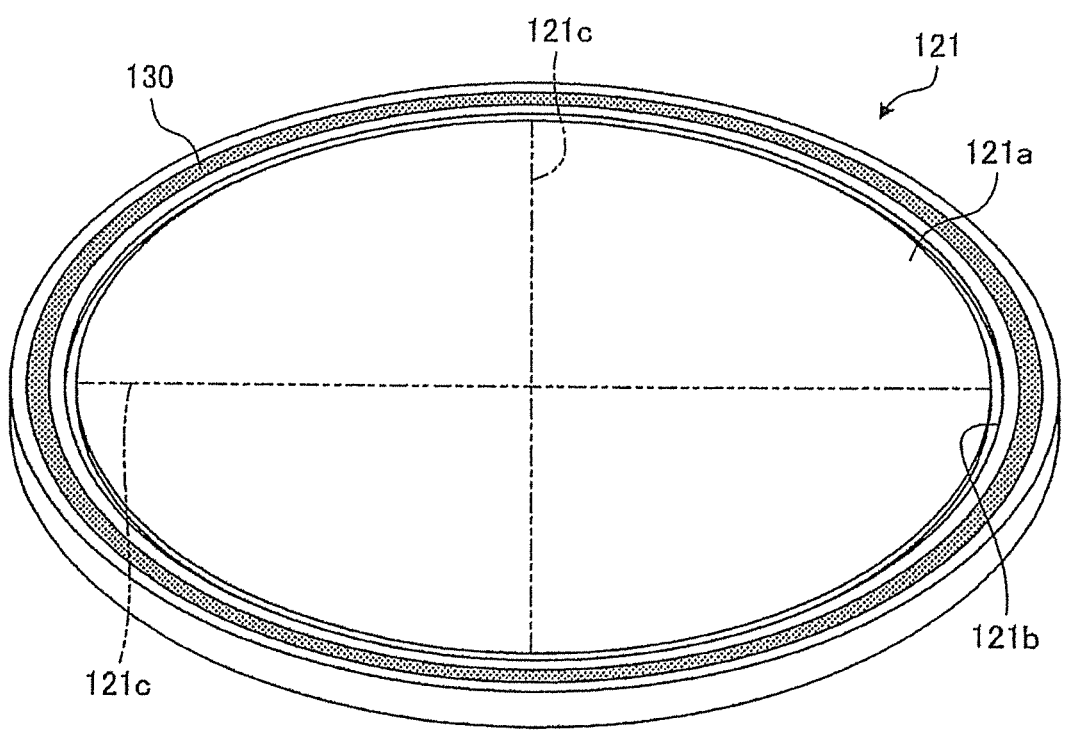
FIG. 12 is a perspective view of a main part of a chuck table according to another embodiment of the present invention.
Figure 13:
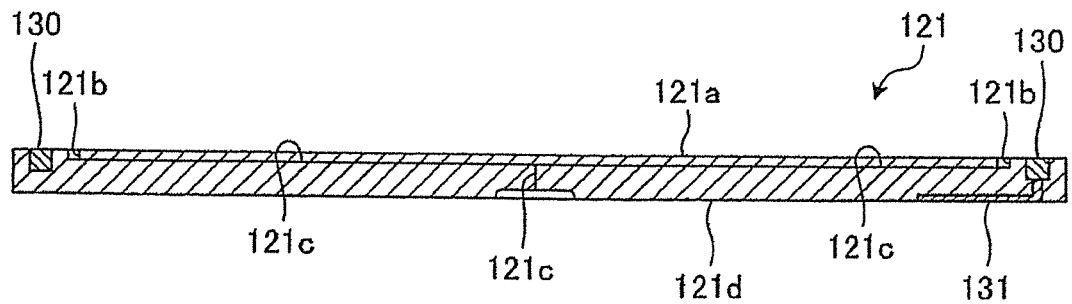
FIG. 13 is a sectional side elevational view of the main part of the chuck table according to the other embodiment.
Figure 14:
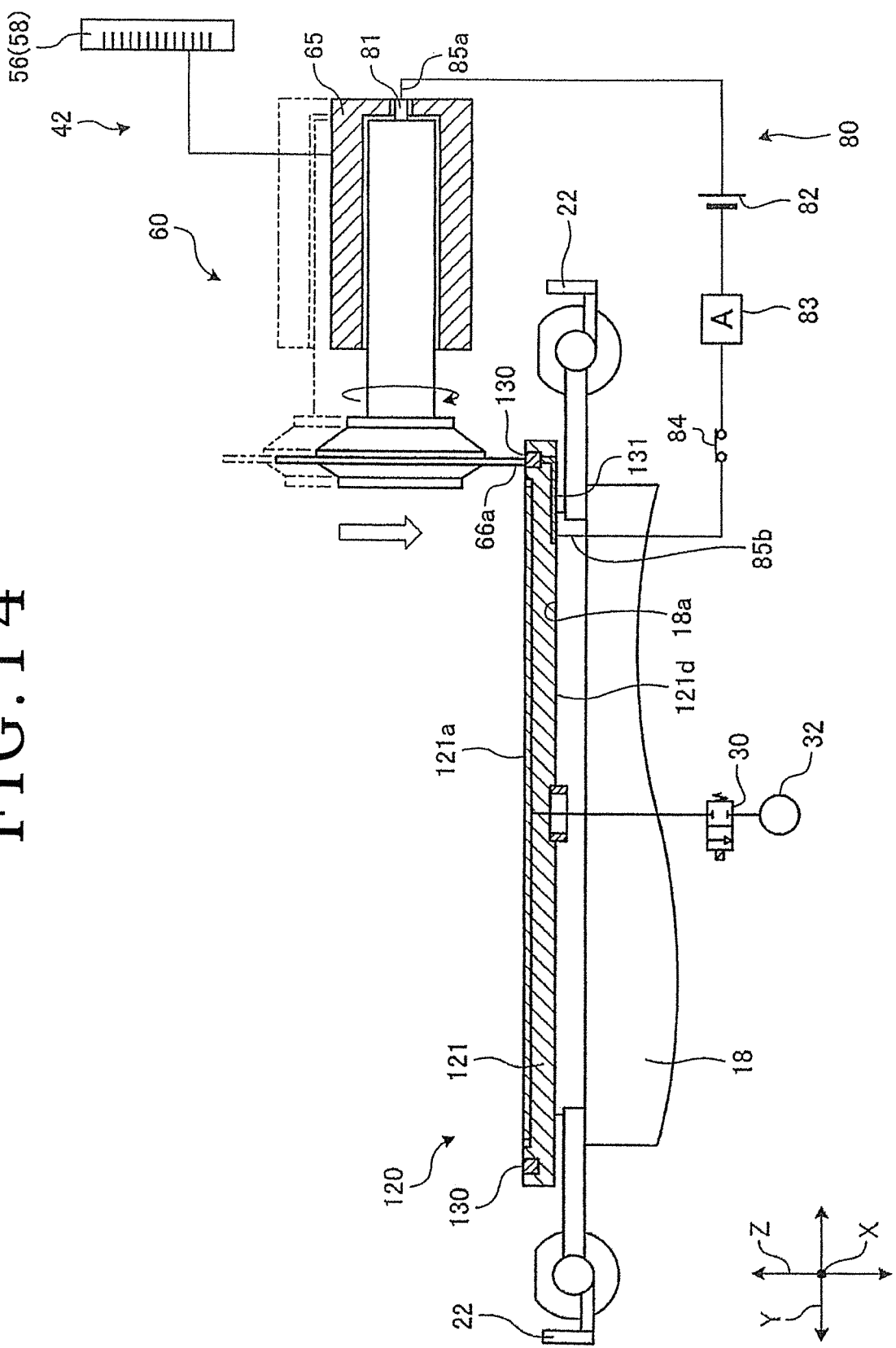
FIG. 14 is a schematic view illustrating a detecting circuit for detecting a home position for a cutting blade according to the other embodiment.

Another embodiment of the present invention will be described in detail below. FIG. 12 is a perspective view of a main part of a chuck table according to the other embodiment. FIG. 13 is a sectional side elevational view of the main part of the chuck table according to the other embodiment. FIG. 14 is a schematic view illustrating a detecting circuit for detecting a home position for a cutting blade according to the other embodiment. Those parts of the other embodiment which are identical to those of the previous embodiment are denoted by identical reference characters. The main part, denoted by 121, of the chuck table, denoted by 120, according to the other embodiment is of a structure equivalent to the main part 21 according to the previous embodiment described above. Specifically, the main part 121 is made of a semiconductor such as silicon or the like and has a flat holding surface 121a for holding the workpiece 100 thereon. As illustrated in FIGS. 12 and 13, the main part 121 has a suction groove or outer circumferential suction groove 121b defined in an outer circumferential region of the holding surface 121a for surrounding the workpiece 100. The suction groove 121b is held in fluid communication with a suction channel 121c defined in the main part 121.

According to the other embodiment, the main part 121 includes an annular conductive member or conductive area 130 exposed on the holding surface 121a and disposed radially outwardly of the suction groove 121b and a contact member 131 joined to the conductive member 130 and exposed on a lower surface 121d of the main part 121. The conductive member 130 and the contact member 131 are made of carbon or resin mixed with carbon, and has a higher level of electric conductivity than semiconductors. As illustrated in FIG. 14, the contact member 131 is held in contact with the upper surface 18a of the chuck table base 18 that supports the main part 121 of the chuck table 120. The contact member 131 is electrically connected to the other end 85b of the lead 85 of the detecting circuit 80 for detecting a home position for the cutting blade 66. When the conductive member 130 on the main part 121 and the lower tip end 66a of the cutting blade 66 contact each other, the cutting blade 66, the conductive member 130, the contact member 131, the switch 84, the ammeter 83, the power supply 82, the electrode terminal 81, and the spindle 64 make a closed circuit. An electric current that flows through the closed circuit is detected by the ammeter 83. According to the other embodiment, since the conductive member 130 and the contact member 131 that are made of a conductor having a higher level of electric conductivity than semiconductors are disposed on the main part 121 that is made of a semiconductor, it is possible to detect, more accurately and quickly, a home position in the Z-axis directions for the lower tip end 66a of the cutting blade 66 when it contacts the conductive member 130.

In the other embodiment, the contact member 131 is exposed on the lower surface 121d of the main part 121 and held in contact with the upper surface 18a of the chuck table base 18. However, the illustrated contact member 131 is not limited to such a layout, but may be modified insofar as it remains electrically connected to the chuck table base 18. For example, a contact member may be disposed on a side surface of the main part 121. Inasmuch as the conductive member 130 is made of carbon or resin mixed with carbon, the conductive member 130 together with the main part 121 may be cut to correct the holding surface 121a according to the chuck table correcting method described above.

Figure 15:
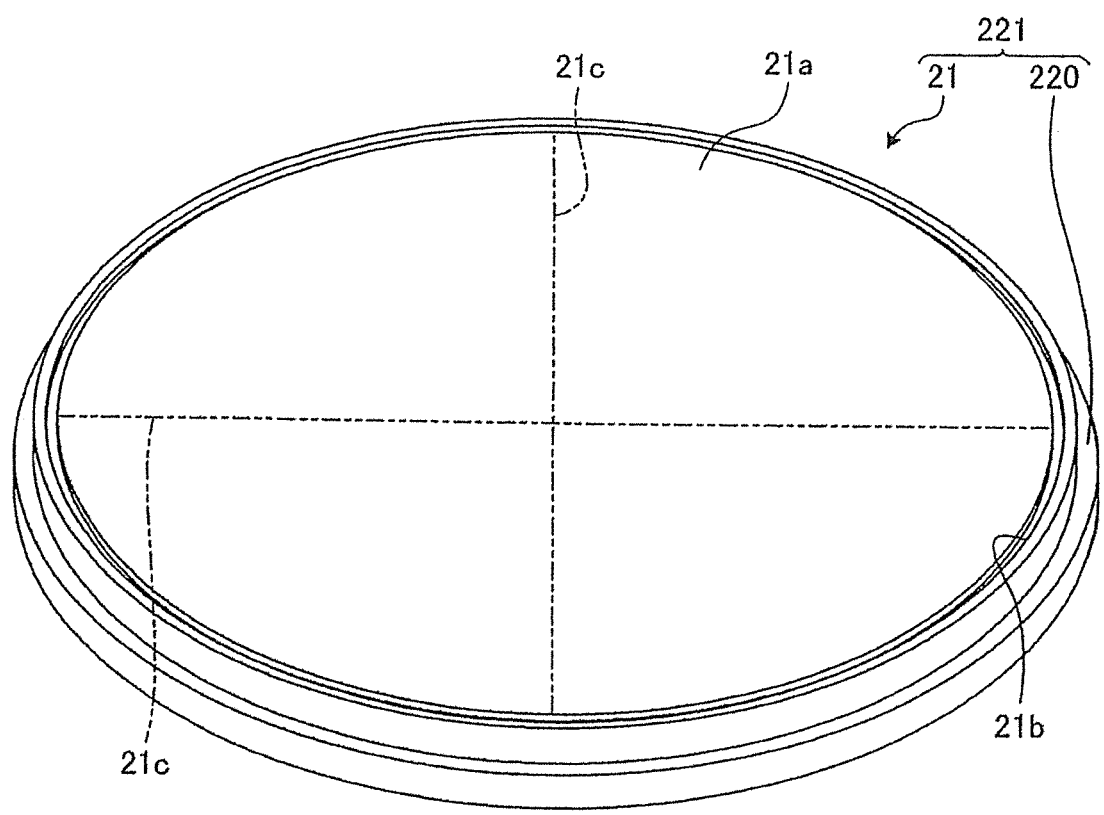
FIG. 15 is a perspective view of a main part of a chuck table according to still another embodiment of the present invention.
Figure 16:
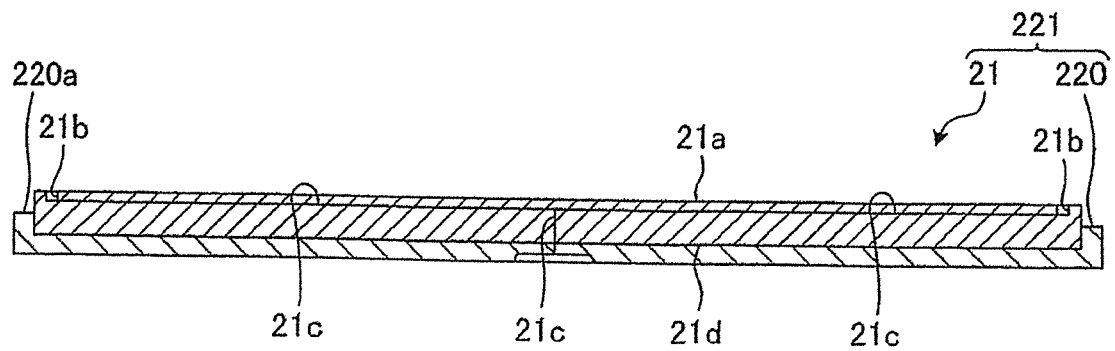
FIG. 16 is a sectional side elevational view of the main part of the chuck table according to the still other embodiment.

Still another embodiment of the present invention will be described in detail below. FIG. 15 is a perspective view of a main part of a chuck table according to the still other embodiment. FIG. 16 is a sectional side elevational view of the main part of the chuck table according to the still other embodiment. According to the other embodiment, a base-combined main part 221 as the main part of the chuck table includes the main part 21 made of a semiconductor described in the previous embodiment and a base 220 covering side and lower surfaces of the main part 21. The base 220 is made of a material that is rigid and electrically conductive, such as metal. Therefore, the base 220 is effective to stiffen the main part 21 disposed thereon and also to make the base-combined main part 221 highly electrically conductive, making it possible to detect, more accurately and quickly, a home position in the Z-axis directions for the lower tip end 66a of the cutting blade 66 when it contacts the conductive member 130. According to the present embodiment, the holding surface 21a of the main part 21 is widely spaced from the upper surface of the base 220, and hence can sufficiently be corrected by being cut by the cutting blade 66.

Figure 17:
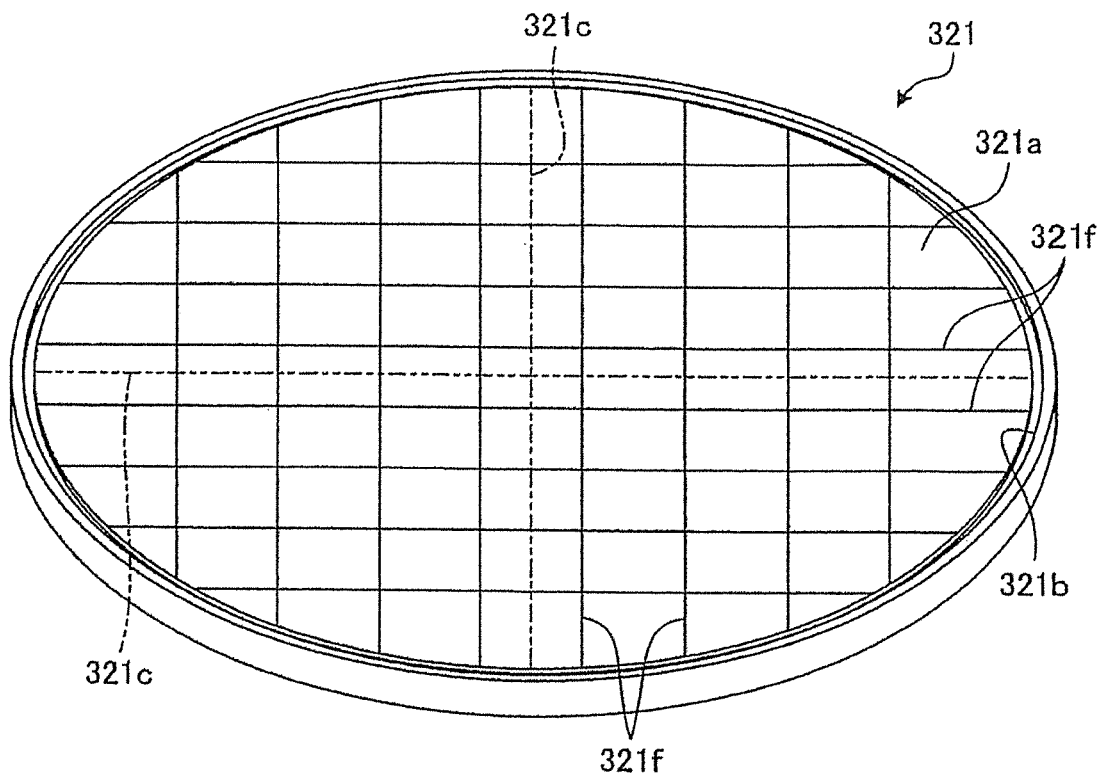
FIG. 17 is a perspective view of a main part of a chuck table according to yet another embodiment of the present invention.
Figure 18:
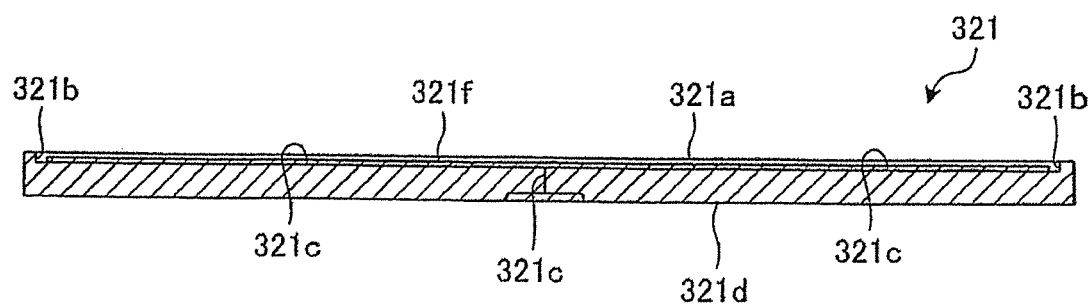
FIG. 18 is a sectional side elevational view of the main part of the chuck table according to the yet other embodiment.
Figure 19:
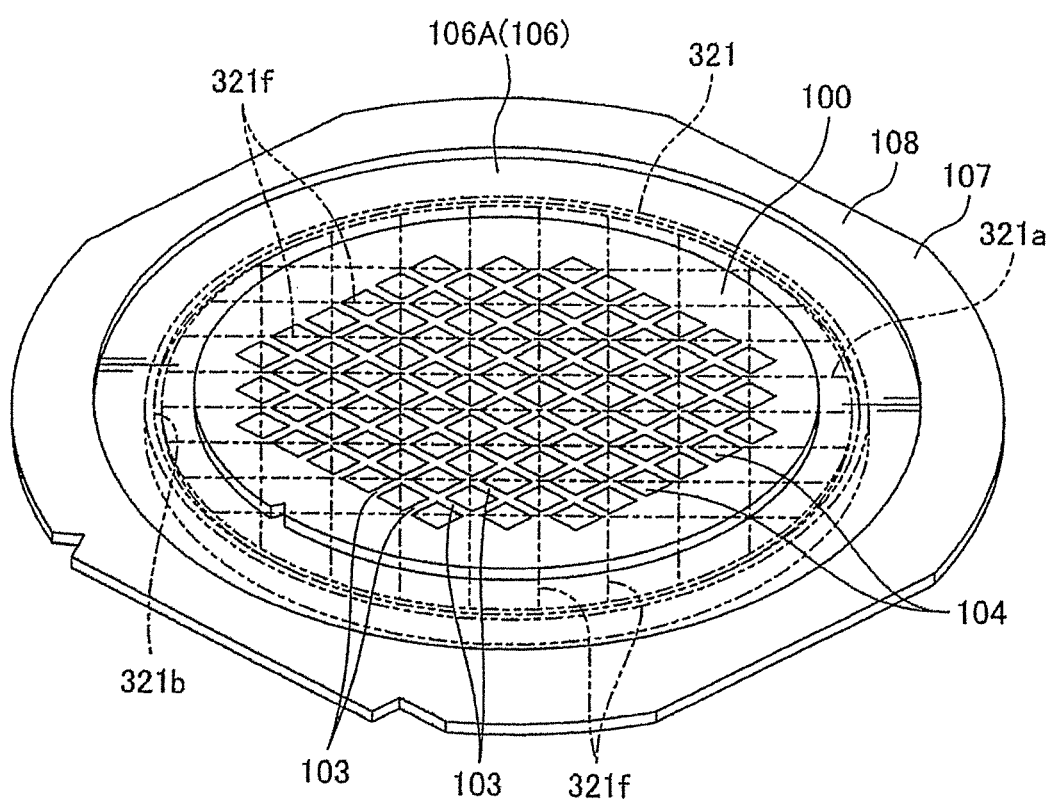
FIG. 19 is a perspective view of the frame unit that is placed on the main part of the chuck table according to the yet other embodiment.

Yet another embodiment of the present invention will be described in detail below. FIG. 17 is a perspective view of a main part of a chuck table according to the yet other embodiment. FIG. 18 is a sectional side elevational view of the main part of the chuck table according to the yet other embodiment. FIG. 19 is a perspective view of the frame unit that is placed on the main part of the chuck table according to the yet other embodiment. The main part, denoted by 321, of the chuck table according to the present embodiment is of a structure equivalent to the main part 21 described above, and will not be described in detail except for the features of the present embodiment. As illustrated in FIG. 17, the main part 321 includes fine grooves or inner suction grooves 321f defined in an area of a holding surface 321a that is positioned radially inwardly of a suction groove 321b. The fine grooves 321f are held in fluid communication with a suction groove 321b. As illustrated in FIG. 18, the fine grooves 321f are closer to the holding surface 321a than the suction channel 321c along thicknesswise directions across the main part 321 and are exposed on the holding surface 321a. According to the present embodiment, the fine grooves 321f extend perpendicularly across each other in a grid pattern on the holding surface 321a of the main part 321. As illustrated in FIG. 19, the fine grooves 321f extend obliquely to the projected dicing lines 103 of the workpiece 100 that is supported on the main part 321, for example, so that cut grooves, not depicted, formed in the workpiece 100 along the projected dicing lines 103 will not overlap the fine grooves 321f as much as possible. Each of the fine grooves 321f has a very small width ranging from approximately 10 μm to 50 μm, for example, thereby reducing the proportion of the fine grooves 321f in the overall area of the holding surface 321a.

As the fine grooves 321f are defined in the area of the holding surface 321a that is positioned radially inwardly of the suction groove 321b, increased suction forces act on the workpiece 100 through the dicing tape 106. In other words, the fine grooves 321f assist in the suction grooves 321b for firmly securing the workpiece 100 to the holding surface 321a. The fine grooves 321f that are defined as described above allow the holding surface 321a to be flat in more areas for producing higher suction forces than a chuck table including a holding surface of porous ceramics that has surface irregularities due to pores thereof. If the workpiece 100 is to be divided into device chips that are 1 mm or less long on each side, then since the device chips remain held on the holding surface 321a under increased suction forces, the device chips are prevented from developing chippings on their reverse sides.

The present invention is not limited to the illustrated embodiments described above, but various changes and modifications may be made in the embodiments. For example, if the cutting blade 66 is made using a hard binder such as a vitrified bond, then since the cutting blade 66 is hard to wear, it is easy for the cutting blade 66 to form corrected surfaces 21e parallel to the X-axis directions and the Y-axis directions. However, the present invention poses no limitations on the types of the cutting blade 66 that can be used.

The structures, methods, etc. according to the above embodiments may be changed or modified within the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chuck table for holding thereon a frame unit including an annular frame and a workpiece supported on the annular frame by an adhesive tape and disposed in an opening defined in the annular frame, comprising:
   a main part having a holding surface for holding thereon the workpiece through the adhesive tape; and
   a frame holder disposed around the main part for holding the annular frame, wherein the main part has:
      a flat surface that functions as the holding surface,
      an outer circumferential suction groove defined in a region of the holding surface that underlies an annular region of the adhesive tape between the workpiece and the frame of the frame unit, for holding the annular region of the adhesive tape under suction, and
      a suction channel held in fluid communication with the outer circumferential suction groove and a suction source,
   the frame holder pulls down the frame to a position lower than the holding surface to hold the adhesive tape in close contact with the holding surface, and
   wherein the flat surface of the holding surface and the region of the holding surface including the outer circumferential suction groove are made of the same material.

2. The chuck table according to claim 1, wherein the outer circumferential suction groove includes an annular groove for surrounding the workpiece.

3. The chuck table according to claim 1, wherein the flat surface that functions as the holding surface is made of silicon.

4. The chuck table according to claim 1, wherein:
   the main part includes a conductive area disposed in a portion of the holding surface and made of a conductor, and
   the conductor of the conductive area is electrically connected to an outer circumferential surface of the chuck table held in contact with a support base that supports the chuck table thereon or a reverse side of the chuck table that is opposite the holding surface thereof.

5. The chuck table according to claim 4, wherein the conductor includes carbon or resin mixed with carbon.

6. The chuck table according to claim 1, further comprising:
   an inner suction groove defined in an area of the holding surface that is positioned radially inwardly of the outer circumferential suction groove and held in fluid communication with the outer circumferential suction groove.

7. The chuck table according to claim 1, wherein the material is a semiconductor.

8. The chuck table according to claim 1, wherein the material is silicon.

9. The chuck table according to claim 1, wherein the flat surface of the holding surface and the region of the holding surface including the outer circumferential suction groove are formed in a cylindrical disk made of a semiconductor material.

10. The chuck table according to claim 9, wherein the semiconductor material comprises silicon.

11. A cutting apparatus for cutting a workpiece with a cutting blade, comprising:
   a chuck table holding thereon a frame unit including an annular frame and the workpiece supported on the annular frame by an adhesive tape and disposed in an opening defined in the annular frame,
   the chuck table including:
      a main part having a holding surface for holding thereon the workpiece through the adhesive tape, and
      a frame holder disposed around the main part for holding the annular frame,
   the main part having:
      a flat surface that functions as the holding surface,
      an outer circumferential suction groove defined in a region of the holding surface that underlies an annular region of the adhesive tape between the workpiece and the frame of the frame unit, for holding the annular region of the adhesive tape under suction, and a suction channel held in fluid communication with the outer circumferential suction groove and a suction source, the frame holder pulling down the frame to a position lower than the holding surface to hold the adhesive tape in close contact with the holding surface, the cutting apparatus, further comprising:
an incising feed unit relatively moving a spindle on which the cutting blade is mounted with respect to the chuck table in incising feed directions perpendicular to the holding surface, and
a detecting circuit detecting a position of a tip end of the cutting blade in the incising feed directions by way of electric conduction between the tip end of the cutting blade and the holding surface of the chuck table, the detecting circuit electrically interconnecting the spindle and the chuck table and detecting the position by way of electric conduction upon contact between the holding surface and the cutting blade.

12. The cutting apparatus according to claim 11, wherein the cutting blade contacts a conductive area of the holding surface.

13. A method of correcting a chuck table of a cutting apparatus, the cutting apparatus including the chuck table, a spindle with a cutting blade mounted thereon for cutting a workpiece held on the chuck table, a processing feed unit relatively moving the chuck table with respect to the spindle in processing feed directions perpendicular to an axis of rotation of the spindle, an indexing feed unit relatively moving the spindle with respect to the chuck table in indexing feed directions parallel to the axis of rotation, and an incising feed unit relatively moving the spindle with respect to the chuck table in incising feed directions perpendicular to the processing feed directions and the indexing feed directions, the chuck table holding thereon a frame unit including an annular frame and the workpiece supported on the annular frame by an adhesive tape and disposed in an opening defined in the annular frame, the chuck table including:
a main part having a holding surface for holding thereon the workpiece through the adhesive tape, and
a frame holder disposed around the main part for holding the annular frame, the main part having:
a flat surface that functions as the holding surface,
an outer circumferential suction groove defined in a region of the holding surface that underlies an annular region of the adhesive tape between the workpiece and the frame of the frame unit, for holding the annular region of the adhesive tape under suction, and
a suction channel held in fluid communication with the outer circumferential suction groove and a suction source, the frame holder pulling down the frame to a position lower than the holding surface to hold the adhesive tape in close contact with the holding surface, the method comprising:
cutting the holding surface with the cutting blade held at a predetermined height for cutting into the holding surface of the chuck table, thereby forming a corrected surface to be used as a new holding surface.

14. The method according to claim 13, further comprising:
causing the cutting blade to cut into the holding surface of the chuck table to a depth smaller than the depth of the outer circumferential suction groove.

\* \* \* \* \*